United States Patent [19]
Thomann

[11] 3,821,667
[45] June 28, 1974

[54] PROCESS AND APPARATUS FOR THE PRODUCTION OF PROPAGATING ELECTRIC ALTERNATING FIELDS

[75] Inventor: Helmut Thomann, Munich, Germany

[73] Assignee: Siemens Aktiengesellschaft, Berlin & Munich, Germany

[22] Filed: May 24, 1973

[21] Appl. No.: 363,715

[30] Foreign Application Priority Data
June 27, 1972 Germany ........................... 2231484

[52] U.S. Cl. ................. 333/30 R, 310/9.8, 330/5.5, 333/72
[51] Int. Cl. ....... H03h 9/06, H03h 9/26, H03h 9/30
[58] Field of Search ............. 333/30 R, 72; 310/8.0, 310/8.1, 8.2, 8.3, 8.5, 9.4, 9.7, 9.8; 330/5, 5.5

[56] References Cited
UNITED STATES PATENTS

| | | | |
|---|---|---|---|
| 2,540,187 | 2/1951 | Cherry, Jr. | 310/9.8 X |
| 2,540,194 | 2/1951 | Ellett | 310/9.8 |
| 3,175,107 | 3/1965 | Brussaard | 310/9.8 |
| 3,451,046 | 6/1969 | Cohler | 333/30 R |

*Primary Examiner*—James W. Lawrence
*Assistant Examiner*—Marvin Nussbaum
*Attorney, Agent, or Firm*—Hill, Gross, Simpson, Van Santen, Steadman, Chiara & Simpson

[57] ABSTRACT

Propagating electric alternating fields are produced in a piezoelectric body in which an acoustic wave is coupled in by means of a transducer, the piezoelectric body having a permanently aligned surface polarization which is periodic in one region of its surface. The polarization is provided by the application of appropriate potentials to polarization electrodes in the form of interdigital electrodes which are temporarily applied to the body and subsequently removed, for example by etching. An acoustic wave having a wave length in the order of magnitude of the period of polarization of the surface polarization is coupled in and electric field components with differing phase velocities are produced in the region of the surface polarization in the space above the surface of the piezoelectric body, the phase velocity of one field component being considerably less than the phase velocity of the other field component. In one embodiment a piezoelectric ceramic body has an electromechanical transducer which serves for output coupling of acoustic waves and a semiconductor body is provided above the surface of the piezoelectric ceramic body in the region of the periodic permanent surface polarization for purpose of amplification. In another embodiment, two piezoelectric ceramic bodies having equal, permanently aligned, periodic surface polarization and each having an electromechanical transducer, are arranged in an overlapping close proximity relationship as an adjustable time delay device.

7 Claims, 3 Drawing Figures

PROCESS AND APPARATUS FOR THE PRODUCTION OF PROPAGATING ELECTRIC ALTERNATING FIELDS

BACKGROUND OF THE INVENTION

1. Field of the Invention

This invention relates to a process and apparatus for the production of propagating electric alternating fields in a piezoelectric body in which an acoustic wave is coupled in by means of a transducer.

2. Description of the Prior Art

In previously known surface wave traveling wave amplifiers wherein a semiconductor body is carried on a ceramic body, the rate of propagation of the surface waves in the ceramic body, and thus the rate of propagation of the electric field above the surface of the ceramic body, is very great in comparison to the drift speed of the charge carriers in the semiconductor body. For this reason, in such cases, the charge carriers in the semiconductor body must be accelerated to such an extent that their speed corresponds to the rate of propagation of the surface waves. However, this involves great difficulties.

Reference may be taken to the publication "IEEE, Transactions on Microwave Theory and Techniques," Vol. MTT-17, Nov. 11 (1969), Pages 912–920, for a surface wave traveling wave amplifier. This publication describes a surface wave traveling wave amplifier in which there is applied to a body consisting of lithium niobate a further body consisting of a semiconductor material. A slowly moving electromagnetic wave is acoustically produced in the body consisting of lithium niobate, which wave is coupled from this body into the semiconductor body and is again coupled from the latter back into the lithium niobate body.

SUMMARY OF THE INVENTION

It is an object of the invention to provide a process and apparatus for executing the process with the aid of which electric fields with previously unknown properties are produced over the surface of a ceramic body by means of surface waves coupled into the ceramic body.

This object is realized through a process as stated above which is characterized in accordance with the invention in that a body with a permanently aligned surface polarization which is periodic in at least one portion of its surface is employed, polarization electrodes being temporarily applied to the body. An acoustic wave which possesses a wave length in the order of magnitude of the period of polarization of the surface polarization is coupled in, and electric field components with differing phase velocities are produced in the region of the surface polarization in the space above the surface of the piezoelectric body, the phase velocity of one field component being considerably lower than the phase velocity of the other field component.

This process is preferably realized with an arrangement which is characterized in accordance with the invention in that on the surface of the piezoelectric ceramic body there is provided an electromechanical transducer which serves for the output coupling of acoustic surface waves, and that over the surface of the piezoelectric ceramic body in the region of the periodic permanent surface polarization there is arranged a semiconductor body. An amplification is achieved by means of this structure.

A further arrangement for executing this process is characterized in accordance with the invention in that at least in a part over the surface of the piezoelectric ceramic body there is arranged a further piezoelectric ceramic body having an equal, permanently aligned, periodic surface polarization.

An advantage which may be achieved by practicing the invention resides in obtaining a rate of propagation of a slow field component in the piezoelectric ceramic body which is approximately equal to the speed of the charge carriers in a semiconductor body arranged above the piezoelectric ceramic body when the structure is designed as a surface wave traveling wave amplifier. In the case of previously known surface wave traveling wave amplifiers, the rate of propagation of the surface waves in the ceramic body, and thus the rate of propagation of the electric field above the surface of the ceramic body, is very great as explained above, in comparison to the drift speed of the charge carriers in the semiconductor body. As also explained above great difficulty is encountered in accelerating the charge carriers in the ceramic body to such an extent that their speed corresponds to the rate of propagation of the surface waves.

A further advantage of the apparatus of the present invention for carrying out the process, when the structure is designed as a surface wave traveling wave amplifier, results from the fact that due to the low rate of propagation of the one field component, and thus due to the small wave lengths of this field component, with a semiconductor body of equal length more wave lengths strike the interaction zone between the semiconductor body and the piezoelectric ceramic body than would be the case with a higher speed field component and thus a greater wave length.

The just mentioned advantage also comes to play in an embodiment of an arrangement for executing the process in accordance with the teachings of the present invention as an arrangement for the coupling over of electric alternating fields.

When a delay line is employed for execution of the process in accordance with the invention, when said delay line possesses a given length, due to the low rate of propagation of the one field component, the delay time may be increased.

BRIEF DESCRIPTION OF THE DRAWINGS

Other objects, features and advantages of the invention, its organization, construction and operation will be best understood from the following detailed description taken in conjunction with the accompanying drawing, on which.

DESCRIPTION OF THE PREFERRED EMBODIMENTS

General Description

Figure 1:
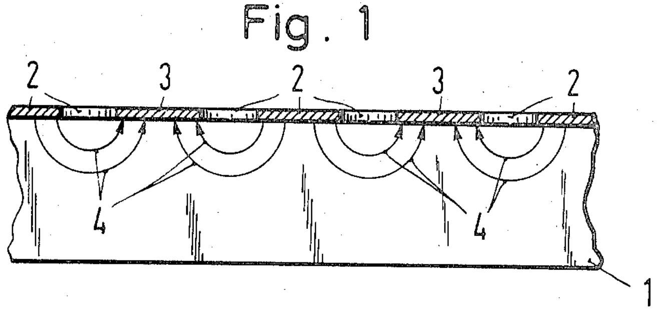
FIG. 1 is a schematic illustration of a piezoelectric ceramic body having a periodic, permanent surface polarization which is produced by electrodes in the form of interdigital structures.

The following considerations led to the invention. When an electric voltage is applied to an interdigital structure which is carried on the surface of a piezoelectric ceramic body, a periodic permanent surface polarization (FIG. 1) arises having a wave number:

$$k_p = 2\pi/a$$

Here $a$ signifies the identity period of the interdigital structure. The identity period is understood herein to mean the distance between adjacent fingers of one of the interlocked combs of the interdigital structure. When the interdigital structures applied to the piezoelectric ceramic body have been removed again, in the polarized zone the body possesses a periodically changing piezo-modulus $d$. The following considerations have been based on the assumption that this piezomodulus is purely sinusoidal.

$$d(x) = \mathrm{d} \sin (k_p \cdot x)$$

It has been further assumed that on the surface of the piezoelectric ceramic body there runs a coupled-in surface wave of the wave number $k_w$ and the cyclic frequency $\omega$ with the lateral deflection $$u(x, t) = u \cdot \sin (k_w x - \omega t).$$

The wave propagation rate of this wave is $$v = \omega/k_w.$$

On the surface of the ceramic body electric potentials $P$ appear which are periodic in time and space and which obey the equation $$P(x, t) = d(x)\ E/\epsilon \cdot u(x, t)$$

wherein $\epsilon$ is the absolute dielectric constant and $E$ is the elasticity modulus of the ceramic body. $E$ and $\epsilon$ are to be independent of the polarization state of the ceramic body. Therefore, the surface potential possesses the form:

$$P(x, t) = E \cdot d \cdot u/\epsilon \sin(k_p x) \sin(k_w x - \omega t)$$

This equation states that the electric field of the acoustic wave is spatially modulated by the polarization. A trigonometric transformation of this equation results in:

$$P(x, t) = E \cdot d \cdot u/2\epsilon \cos[(k_p - k_w)\ x + \omega t] - \cos[(k_p + k_w)\ x - \omega t]$$

This equation indicates the geometrical Fourier analysis of the potential distribution. The potential distribution, and thus also the electric fields may be split up into two components. These components possess wave numbers which are equal to the sum and the difference of the wave numbers of the acoustic wave and the polarization. The two components move along the surface at different phase velocities:

$$v_{p1} = \omega/(k_p - k_w)$$

$$v_{p2} = \omega/(k_p + k_w)$$

Here the frequency remains unchanged.

In accordance with the invention, an acoustic wave is coupled into the piezoelectric body, the wave length of this wave being in the order of magnitude of the period of polarization of the permanently aligned surface polarization.

If the acoustic wave possessed a considerably greater wave length, a poor coupling would result as in this case the depth of penetration of the acoustic wave into the piezoelectric material would not agree with the depth of penetration of the periodic, permanent coupling.

When the wave length of the acoustic wave is considerably shorter, in the region of the periodic, permanently aligned surface polarization there arise field components whose speeds corresponds approximately to the speed of the coupled-in acoustic wave.

DETAILED DESCRIPTION

In FIG. 1 a piezoelectric ceramic body 1 has disposed on its surface two comb-like polarization electrodes, the fingers 2 and 3 of which are interlocked. Preferably, these electrodes are vaporized into position on the surface of the ceramic body 1. In the figure, the fingers of the electrode 2 are shown in section, as is also the rear connection of the fingers. In the case of the electrode 3, the fingers are merely shown in section. During the polarization process, the negative pole is, for example, applied to the electrode 2 and the positive pole of the polarization voltage is applied to the electrode 3. This polarization voltage amounts to, for example, 2V/μm relative to the finger distance, the ceramic body being surrounded, with the interdigital structures, by oil. The temperature on polarization amounts e.g., to approximately 150°C. The characteristic, permanent, periodic polarization then results, indicated by the arrows 4, from the comb fingers of the one electrode 2 to the comb fingers of the other electrode 3. When the ceramic body 1 has been provided with this desired polarization, the polarization electrodes 2, 3 are removed from the surface of the ceramic body, preferably etched away.

Figure 2:
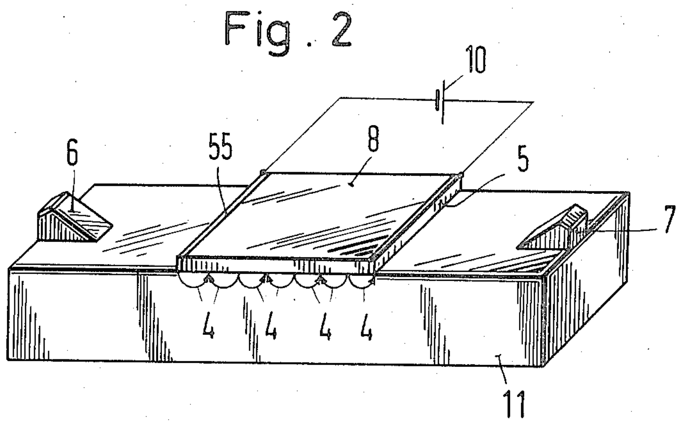
FIG. 2 is a schematic representation of an arrangement for the execution of the process in accordance with the invention, which arrangement is designed as a surface traveling wave amplifier.

Referring to FIG. 2, an arrangement is illustrated for the execution of the process in accordance with the invention, which arrangement is designed as a surface wave traveling wave amplifier. In the aforementioned IEEE publication, a surface wave traveling wave amplifier is described in which there is a body of lithium niobate having disposed adjacent thereto a semiconductor material. As explained above, a slowly moving electromagnetic wave is acoustically produced in the body of lithium niobate, which wave is coupled from this body into the semiconductor body and is again coupled back from the semiconductor body to the lithium niobate body.

In accordance with the invention, it is now proposed that in place of a lithium niobate body, a piezoelectric ceramic body, and in fact one which possesses a periodic permanent polarization produced as set forth above, be employed. This piezoelectric ceramic body is provided in FIG. 2 with the reference character 11. The lines of the permanent polarization of the body 11 again bear the reference character 4. Preferably, the periodic, permanent surface polarization is produced only in the region below the semiconductor body 8. The semiconductor body 8 is preferably applied in close proximity to the piezoelectric body 11. An interval can possibly be provided between the piezoelectric body 11 and the semiconductor body 8 which, however, is contrived to be so small that the electric alternating fields are still coupled over. This interval is then preferably filled with a liquid having a high dielectric constant. As already described above, when an acoustic surface wave is coupled into the body 11, with the aid of the transducer 6, in the body 11 there arise electric alternating fields with field components of different phase velocities above the areas of the permanent surface polarization. The slow field component is coupled into the semiconductor body 8. The phase velocity of this field component corresponds, in terms of order of magnitude, to the rate of propagation of the charge carriers in the semiconductor body 8 in the field of the voltage applied through the voltage source 10 by means of the electrodes 5 and 55 connected to the semiconductor body. The field component amplified by the charge carriers of the semiconductor body 8 is coupled back into the piezoelectric body 11. The amplified surface wave is coupled out of this body in the output transducer 7.

The transducers 6 and 7, can, for example, be the known wedge-shaped transducers or interdigital transducers of the conventional type, and these transducers can be arranged in an arbitrary fashion on the surface of the ceramic body.

The transducers preferably serve to couple waves of the Rayleigh type into the piezoelectric ceramic body.

Figure 3:
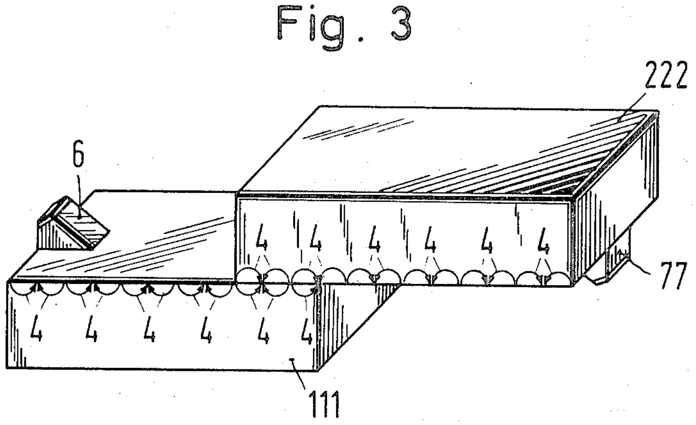
FIG. 3 is a schematic representation of a further arrangement for the execution of a process in accordance with the invention which takes the form of an arrangement for coupling electric alternating fields from a piezoelectric ceramic body into another piezoelectric ceramic body.

Referring to FIG. 3, an arrangement is illustrated for the execution of the process in accordance with the invention, which arrangement takes the form of an arrangement for coupling electric alternating fields, for example, as a delay line of adjustable delay time. Here, the body consisting of piezoelectric ceramic is provided with the reference character 111. On this body 111 an input transducer 6 is applied and serves to couple an acoustic surface wave into the body 111. Another piezoelectric ceramic body 222 is partially applied to the piezoelectric body 111 in an overlapping relationship. The piezoelectric bodies are preferably arranged closely upon one another. Between the bodies there can possibly be an interval which, however, is designed to be so small that the electric alternating fields can still be coupled over. This distance is then preferably filled with a liquid possessing a high dielectric constant. The surfaces of the two bodies overlap in the region in which the electric alternating fields are to be coupled over. The output transducer 77 is applied to the body 222 on the surface which faces toward the surface of the body 111. The two bodies 111 and 222 are periodically and permanently poled in the manner illustrated in FIG. 3. The lines of these polarities again bear the reference character 4. By way of the input transducer 6 an acoustic surface wave is coupled into the body 111. This wave extends over the surface of the body 111 and is accompanied by electric alternating fields which run across this surface. As already described, these alternating fields consist, in the areas of the permanent polarization, i.e., on the entire surface of the body 111, of field components of different phase velocities. In the region of the overlap of the two bodies, these field components couple electric alternating field into the body 222. In this case, in accordance with a feature of the invention, the coupling is particularly favorable since, due to the short wave length of the field component which possesses a slow phase velocity there is space for considerably more wave lengths on the region of the overlap of the bodies 111 and 222 than would be the case in rapidly propagating electric alternating fields.

The periodic, permanent polarization preferably extends over the entire surface of the piezoelectric ceramic bodies 111 and 222 since these are arranged to be displaceable relative to one another.

The transducers 6 and 77 can, for example, take the form of wedge-shaped transducers or interdigital transducers of conventional type, and these transducers can be arranged in an arbitrary fashion on the surface of the ceramic bodies.

Preferably waves of the Rayleigh type are coupled via these transducers into the piezoelectric ceramic body.

Although I have described my invention by reference to specific illustrative examples thereof, many changes and modifications of my invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of producing propagating electric alternating fields in a piezoelectric body, comprising the steps of:

temporarily applying polarization electrodes to a surface of the body in a pattern which will produce periodic aligned surface polarization;

energizing the electrodes to provide a permanent, aligned, periodic surface polarization of the piezoelectric body; and connecting a transducer to the surface of the body for coupling in an acoustic wave having a wave length in the order of magnitude of the period of polarization which produces electric field components having differing phase velocities in the region of the surface polarization in the space above the surface of the piezoelectric body, the phase velocity of one field component being considerably lower than the phase velocity of another field component.

2. The method set forth in claim 1, wherein the step of temporarily applying polarization electrodes is further defined as:

applying to the surface a pair of interdigital electrodes each having fingers extending between adjacent fingers of the other interdigital electrode; and removing the interdigital electrodes from the surface of the piezoelectric body after the electrodes have been energized to provide the permanent polarization.

3. A surface wave traveling wave amplifier, comprising:

a piezoelectric body including a surface having at least a portion thereof polarized with a permanent, aligned, periodic surface polarization;

a pair of electromechanical transducers mounted on said surface on respective sides of said polarized portion; and a semiconductor body in close proximity to said polarized portion of said surface, an acoustic surface wave coupled into said body by one of said transducers effecting electric alternating fields having field components of different phase velocities above said polarized portion of said surface, the slower field component being coupled into said semiconductor body, amplified by the charge carriers of said semiconductor body and coupled back to said piezoelectric body to be coupled out by the other transducer.

4. A surface wave traveling wave amplifier as set forth in claim 3 comprising a liquid with a high dielectric constant between said piezoelectric body and said semiconductor body.

5. A delay line comprising:

first and second piezoelectric bodies each having a surface which is polarized with a permanent, aligned, periodic surface polarization, said polarized surfaces facing each other with said bodies positioned in an overlapping relationship;

an input transducer carried on said polarized surface of said first piezoelectric body for coupling in an acoustic surface wave to effect electric alternating fields traversing said surface and having field components of different phase velocities, said field components coupled to said second body in the region of overlap of said bodies; and an output transducer carried on the polarized surface of said second body for coupling out an output in response to the field components coupled from said first body to said second body.

6. A delay line as set forth in claim 5, wherein said bodies are displaceable relative to one another to provide an adjustable delay line.

7. The delay line according to claim 5, comprising a high dielectric constant liquid between the overlapping portions of said bodies.

* * * * *